United States Patent [19]

Riederer

[11] Patent Number: 4,573,014

[45] Date of Patent: Feb. 25, 1986

[54] NMR IMAGING METHOD AND APPARATUS

[75] Inventor: Stephen J. Riederer, Durham, N.C.

[73] Assignee: Duke University, Durham, N.C.

[21] Appl. No.: 550,198

[22] Filed: Nov. 9, 1983

[51] Int. Cl.[4] ............................................. G01R 33/20
[52] U.S. Cl. ..................................... 324/307; 324/312
[58] Field of Search ............... 324/309, 312, 314, 300, 324/307, 310, 311; 378/99; 364/414

[56] References Cited

U.S. PATENT DOCUMENTS

| | | | |
|---|---|---|---|
| 3,789,832 | 2/1974 | Damadian | 324/309 |
| 4,045,723 | 8/1977 | Ernst | 324/309 |
| 4,284,948 | 8/1981 | Young | 324/309 |
| 4,292,977 | 10/1981 | Krause et al. | 128/712 |
| 4,297,637 | 10/1981 | Crooks et al. | 324/309 |
| 4,300,096 | 11/1981 | Harrison et al. | 324/309 |
| 4,307,343 | 12/1981 | Likes | 324/309 |
| 4,318,043 | 3/1982 | Crooks et al. | 324/309 |
| 4,354,499 | 10/1982 | Damadian | 324/309 |
| 4,355,282 | 10/1983 | Young et al. | 324/309 |
| 4,390,840 | 6/1983 | Ganssen et al. | 324/309 |

OTHER PUBLICATIONS

Wehrli et al., "The Dependence of Nuclear Magnetic Resonance (NMR) Image Contrast on Intrinsic and Operator-Selectable Parameters", presented at meeting of SPIE, Medicine XII, vol. 419, Apr. 1983.
Baines et al., "An Improved Picture Display for NMR Imaging", Journal of Physics E: Scientific Instruments, vol. 9, pp. 809-811, 1976.
"Contrast in NMR Imaging," I. R. Young, pp. 387-388.
NMR Characteristics of Rat Tissues, "Intensity and Calculated NMR Images," pp. 75-78.
Journal of Magnetic Resonance 49 (1982), Ronald Crouch, "An Iterative Linear Method for Calculation of Spin-Lattice Relaxation Times," pp. 371-372.
"Optimal Spin Echo Images for Liver Lesions by Retrospective Calculations," Peter L. Davis, p. 104.
"Calculated NMR Images," D. Ortendahl, pp. 272-273.
SPIE vol. 314, Digital Radiography (1981), S. J. Riederer, "System for Automated Real-Time Generation of Higher Order Energy Subtraction Images in Digital Fluoroscopy".
Journal of Computer Assisted Tomography, W. A. Edelstein, "Signal, Noise, and Contrast in Nuclear Magnetic Resonance (NMR) Imaging," pp. 391-401.

Primary Examiner—Ernest F. Karlsen
Assistant Examiner—Kevin D. O'Shea
Attorney, Agent, or Firm—Oblon, Fisher, Spivak, McClelland & Maier

[57] ABSTRACT

Intrinsic parameters $T_1$, $T_2$ and $M_o$ of the materials in a body under NMR examination are determined by conducting a small number of actually NMR measurements and analyzing the derived data, the measurements being made at different repetition and delay times. The intrinsic parameters are then used to synthesize images which simulate those which would have been generated using other delay and repetition times in an actual measurement process. A processing apparatus is disclosed which operates in real time, permitting an operator to interactively modify the delay and repetition times while observing successive displays which simulates measurements made using those times.

14 Claims, 6 Drawing Figures

NMR IMAGING METHOD AND APPARATUS

BACKGROUND OF THE INVENTION

1. Field of the Invention

This invention relates generally to a method and apparatus for producing images of the interior of a body, such as a human body, using data derived from NMR measurement techniques, and more particularly to a method and apparatus for synthesizing computed images based on a minimal number of such measurements.

2. Description of the Prior Art

Nuclear magnetic resonance (NMR) is a physical phenomenon which has been used in recent years to produce images of the interior portions of bodies, particularly human bodies, for diagnostic and other purposes. The images produced using NMR techniques are particularly useful when the interior of the body or body portion contains a variety of relatively soft tissues but can be employed under a rather wide variety of circumstances. Such images have been compared with those obtained by radiographic techniques, but NMR images portray different characteristics and, particularly, some characteristics which are not easily portrayable by radiographic or other imaging methods, if at all.

An excellent fundamental description of basic NMR physics and imaging techniques is found in Kaufmann et al, Nuclear Magnetic Resonance Imaging in Medicine, Igaku-Shoin Medical Publishers, Inc., New York and Tokyo (1981). There are some features of NMR and of common techniques for producing NMR images which are particularly important in the present context and will be reviewed.

In NMR examinations, the body being examined is subjected to one magnetic field which is usually constant in magnitude and another field which lies along at least one different vector from the first and is usually time-varying, the exact characteristics of these fields being a function of choice between any one of several available imaging techniques. In any such technique, there are characteristics of the field energy which must be selected in advance. In spin echo imaging, for example, one selects the repetition time $T_R$ which is defined as the time between successive alternations in a transverse field, and the sampling delay time $\tau$ (Tau). The signals resulting from the impositions of the fields in accordance with the selected times are detected and stored or recorded. The levels of these signals, correlated with their physical positions, can be represented by a matrix of numbers and the numbers can, in turn, be displayed as a matrix of points or pixels having different light or dark levels, the composite of these pixels being usable to form an image wherein the differences appear as differences in contrast.

The contrast in an image is extremely important because it is that contrast which permits the examiner, such as a physician, to observe and analyze the "slice" of the body of which the image was made and, in a medical context, to thereby form a diagnosis. The degree of contrast is a function of the $T_R$ and $\tau$ values which are selected before the measurements are made and also of the intrinsic properties of the materials including net magnetization $M_o$ (which is proportional to proton density P), and the relaxation times $T_1$ and $T_2$. However, a set of $T_R$ and $\tau$ values will, in most cases, produce an image with excellent contrast between certain sets of materials but insufficient contrast between other materials. It is therefore necessary to make numerous sets of measurements with various and $T_R$ and $\tau$ values and to observe the images resulting from those measurements in order to be able to adequately examine the various tissues involved.

As will be recognized, this is a time-consuming process in which the patient is often subjected to discomfort and, in addition, is repeatedly subjected to the effects of a rather strong, unidirectional magnetic field. For certain measurements, body movement must be prevented during each measurement, the duration of which may last in the order or seconds or minutes, depending upon the pulse sequence technique being used and the materials under observation. These conditions establish rather severe limitations on the length of time which can be taken for such measurements, and therefore, the number of measurements which can be made. Furthermore, it is not always possible for the examining physician to recognize in advance or at the time of the measurements which materials are most significant in the images.

Additional background information and disclosures of devices and techniques in the field to which this invention relates can be found in the following articles and U.S. patents.

Wehrli, F. R., J. R. MacFall, and G. H. Glover. The dependence of nuclear magnetic resonance (NMR) image contrast on intrinsic and operator-selectable parameters. Presented at the meeting of the SPIE, Medicine XII, Volume 419, April, 1983.

Young, I. R. et al. Contrast in NMR Imaging. Presented at the Society of Magnetic Resonance in Medicine, August, 1983.

Ortendahl D., et al. Calculated NMR images. Presented at the Society of Magnetic Resonance in Medicine, August, 1983.

Davis, P. L., et al. Optimal spin echo images for liver lesions by retrospective calculations. Presented at the Society of Magnetic Resonance in Medicine, August, 1983.

| U.S. Pat. No. | Inventor |
| --- | --- |
| 3,789,832 | Damadian |
| 4,045,723 | Ernst |
| 4,284,948 | Young |
| 4,292,977 | Krause et al |
| 4,297,637 | Crooks et al |
| 4,307,343 | Likes |
| 4,318,043 | Crooks et al |
| 4,354,499 | Damadian |
| 4,355,282 | Young et al |
| 4,390,840 | Ganssen et al |

SUMMARY OF THE INVENTION

Accordingly, an object of the present invention is to provide a method in which a minimal number of measurements are made and in which the data derived from these measurements is used to form synthetic images which include tissue contrasts of a type which would have been produced by measurements made with selected parameters such as $T_R$ and $\tau$ values other than those which were actually used for the measurements.

A further object is to provide an apparatus which is capable of obtaining intrinsic parameters of the body materials under examination and forming synthetic images based on those intrinsic parameters to permit the synthesis of images formed on the basis of other selectable parameters.

Yet another object is to provide a system in which an individual can interactively modify one or both of the selectable parameters repeatedly to produce images having various contrast characteristics until an image having optimum contract characteristics between desired materials is formed.

Yet another object is to provide a technique in which the variable values are selectable and images producable substantially immediately, on a real-time basis, thereby permitting feedback and repetitive imaging after only a few actual measurements on the body being examined.

Briefly, these and other objects of the invention are achieved by a method of forming computed images of materials within a body based on measurements of NMR characteristics of the body comprising the steps of selecting a set of values for at least one parameter including either pulse-delay $\tau$ or repetition time $T_R$, or both, to be used in a small number of NMR measurements and making the measurements using those selected parameters in a predetermined NMR pulse sequence while collecting the data from which images of the body materials can be formed. Selected intrinsic parameters of the body materials are then calculated from the collected data for each point in a matrix of points in the body, the intrinsic parameter including one or more of spin-lattice relaxation time $T_1$, spin-spin relaxation time $T_2$ and net magnetization or proton density $M_o$. Then, for each point in the matrix, a signal is computed, the signal being representative of a brightness based on the intrinsic parameters and an arbitrarily chosen set of selectable parameters, thereby forming a matrix of brightness signal levels from which an image can be synthesized and displayed.

After calculation of the intrinsic parameters, the step of computing and be repetitively performed and images based thereon successively synthesized and displayed, using arbitrary sets of values and observing the results on a real-time basis.

In another aspect, the invention comprises a video processor for synthesizing and displaying images derived from NMR measurements of a body comprising means for performing NMR measurements on the body using a predetermined pulse sequence, control means for selectively establishing parameters controlling the characteristics of the pulse sequence including at least one of pulse-delay time $\tau$ and repetition time $T_R$ and means for storing data from the measurements. The apparatus further comprises means for calculating from the data the intrinsic parameters for each of a matrix of pixels representative of points in the body, the parameters including at least one of spin-lattice relaxation time $T_1$, spin-spin relaxation time $T_2$ and net magnetization $M_o$; and for storing the parameters, and means for computing and storing a value for each pixel in the matrix representative of a brightness level, each such value being derived from the intrinsic parameter values for the point, a selected pulse sequence relationship and selected parameters $T_R$ and $\tau$, thereby forming a matrix representing a displayable image, and means for displaying that image.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

As previously mentioned, and as is well understood in the art, the brightness or lightness of signals observed in an NMR image depend upon the characteristics of the tissue being examined, these characteristics being described as intrinsic parameters of the tissue and including hydrogen or proton density, which is also described as the degree of magnetization $M_o$; a first delay $T_1$ which is defined as the spin-lattice relaxation time because of the energy interchange phenomenon which occurs between the spin and the lattice in which the molecule resides; and a second interval $T_2$ which is defined as the spin-spin relaxation time for analogous reasons. For non-stationary substances, there is also a vector flow velocity characteristic, but this characteristic will be largely ignored herein. These intrinsic parameters of the body under investigation, as will be recognized, differ from one tissue type to another as to hydrogen or proton density as well as the relaxation times, fatty tissues, for example, being much higher in hydrogen density than the lungs or than air itself. These intrinsic parameters, however, can have a greater or smaller effect on the intensity of the detected signal, depending upon the relative amplitudes of the selectable parameters $T_R$ and $\tau$. Various NMR pulse sequences can be used to analyze material, such as inversion recovery, spin-echo or partial saturation. The relationship between signal strength and these fixed and intrinsic parameters are rather well understood such that, for any two materials having different and known relaxation time values, one or both of the parameters $T_R$ and $\tau$ can be selected in advance so as to maximize the difference in intensity signals between them, providing optimum contrast.

Figure 1:
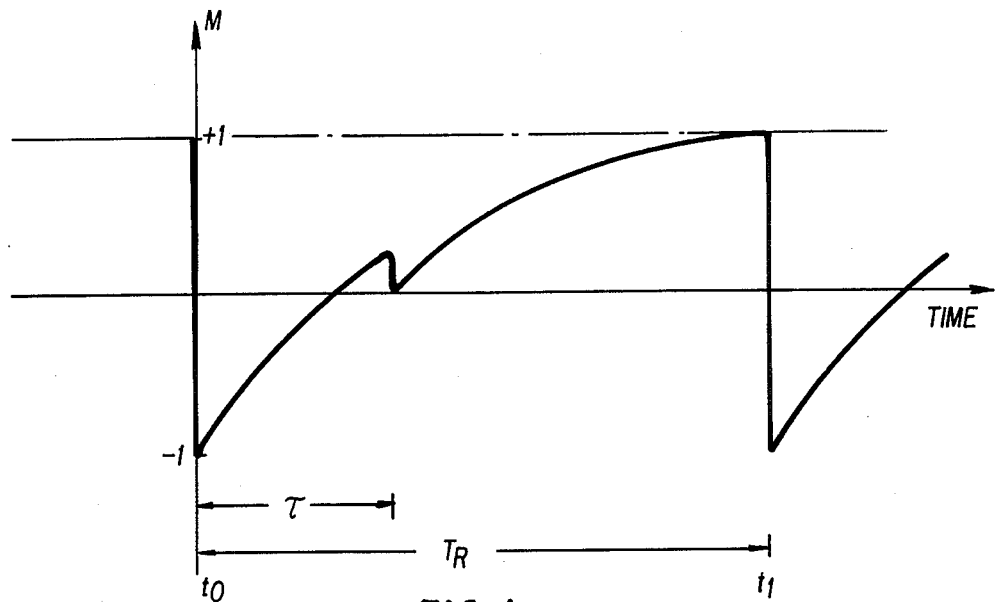
FIG. 1 is a graphical representation of characteristics of one pulse sequence measurement cycle for purposes of defining terms.

FIG. 1 is an illustration of a typical magnetization characteristic in an inversion recovery pulse sequence which begins at time $t_0$ with a reversal of normalized longitudinal magnetization from a $+1$ to $-1$ value. Immediately after this flip, the magnetization of the material begins to return toward the original value and, if uninterrupted, returns to the original value in an interval of time which can be measured in milliseconds or seconds, depending upon the material and other factors. In the example illustrated, a measurement is made after a delay interval $\tau$, causing a momentary reversal in the magnetization from which the magnetization again begins to return to its original state.

A new sequence is initiated after a repetition time $T_R$, starting a new cycle at time $t_1$. As will be recognized, the values of $\tau$ and $T_R$ can be selected by the system operator and these will have an impact on the contrast brightness.

For spin-echo imaging, the brightness S is proportional to an exponential function of the intrinsic and selectable parameters, as follows:

$$S \propto M_o\{1 - 2e^{-(TR-\tau)/T1} + e^{-TR/T1}\}e^{-2\tau/T2}$$

wherein $M_o$, net magnetization at equilibrium.

In the following discussion, spin echo imaging will be used as the example because it involves both $T_1$ and $T_2$. The technique is, however, useful with other NMR imaging signal systems such as a modified spin-echo sequence in which $$S \propto M_o(1 - e^{-TR/T1})e^{-2\tau/T2},$$

where $T_R >> \tau$; an inversion recovery (IR) sequence in which $$S \propto M_o(1 - 2e^{-\tau/T1} + e^{-TR/T1});$$

or a partial saturation (PS) sequence in which $$S \propto M_o(1 - e^{-TR/T1}).$$

It will be observed that in the spin echo and IR relationships both $T_R$ and $\tau$ are available for operator control but in PS only $T_R$ is controllable.

The present invention is based in part on the recognition of the fact that measurements made for several different delay times and repetition times result in data which permits the calculation of the intrinsic parameters $M_o$, $T_1$ and $T_2$ for the tissues in the sample under observation and thus supplies sufficient data to permit synthesis of other images.

In the performance of the method, measurements are first made using several different delay times $\tau_m$ and repetition times $T_n$. Then, from the data gathered from these measurements, $T_1$ and $T_2$ are determined for all points in the image, providing the numerical skeleton for a matrix of all points. At each point, the relaxation times remain the same. In other words, the fundamental relaxation times of the materials themselves do not change as a function of the input signal characteristics. Thus, it is possible, using the example of spin-echo imaging, to employ the values of $M_o$, $T_1$ and $T_2$ in the first expression given above along with a variety of selected values of $T_R$ and $\tau$ to produce mathematically generated NMR images which present the appearance of images made as a result of tests with other T and $\tau$ values, even though those values were never actually used in the pulse sequence. With a limited number of measurements, images for a variety of other arbitrary pulse sequences and selectable parameters can be formed. It is necessary only to construct hardware which implements the brightness relationships given above, or the appropriate one of these relationships, or a relationship characteristic of another mode of NMR imaging, and insert the desired values. Alternatively, a computer can be programmed to accept such data and perform the necessary operations. As will be recognized, the specific relationships for S set forth herein are neither novel nor critical to the operation of the invention. Rather, it is only necessary to employ the known relationship which is appropriate to the NMR pulse sequence being employed.

If the operator selects the values of $T_R$ and $\tau$ which were used in one of the actual tests, the resulting synthesized image would match or be very close to the original image obtained.

Figure 2:
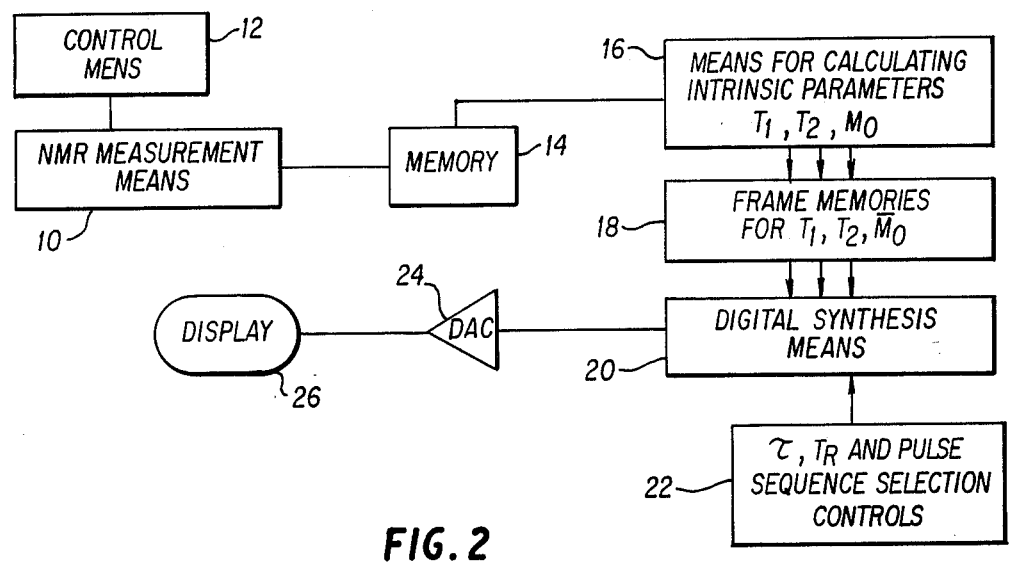
FIG. 2 is a schematic block diagram of an apparatus for performing the overall method of the invention.

An apparatus for accomplishing the above is illustrated in block diagram form in FIG. 2 wherein an NMR measurement apparatus 10 is under the control of a conventional control means 12 by which the various operations of the system can be controlled in a well-known fashion. The measurement and control means 10, 12 can be in accordance with the previously discussed prior art or in accordance with the Kaufmann et al text, the important feature for present purposes being that the control means must permit the selection of delay and repetition times.

The results of several measurements, perhaps three or four, are stored in a memory 14. This data is then subjected to processing by which the intrinsic parameters of the body materials examined by the NMR measurement are calculated, this being illustrated as accomplished by a processor 16 which can be a suitable minicomputer programmed to calculate $M_o$, $T_1$ and $T_2$. An example of results obtained by such calculation are presented in Wehrli et al, "Parameters Determining the Appearance of NMR Images", *Modern Neuroradiology: Advanced Imaging Techniques* Eds. T. H. Newton and D. G. Potts (San Anselmo: Clavadel Press), 1983, pp. 81-118. If the measurements themselves are initially made using a reasonable spread of delay time and repetition times, the intrinsic parameters can be readily calculated and stored in frame memories 18 which can, for example, be part of a Gould/DeAnza IP 8400, a commercially available image processor which is readily adaptable for use in the apparatus of FIG. 2.

For purposes of synthesizing images using the originally employed selectable parameters as well as others, the intrinsic parameter values are supplied to a digital synthesis means 20 which is coupled to an interactive control 22 which permits the selection of $\tau$, $T_R$ and the form of NMR pulse sequence. The synthesis means forms a frame of pixels based on the stored intrinsic parameters and the selected selectable parameters and supplies these to a digital to analog converter 24 which supplies them, with suitable level management, to a conventional monitor 26 for display.

Figure 3:
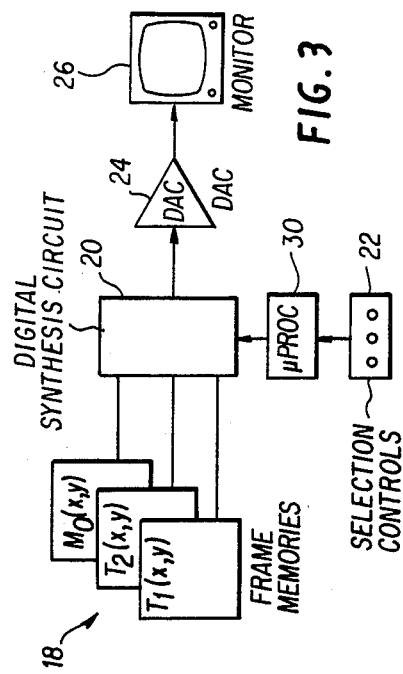
FIG. 3 is a schematic block diagram showing in greater detail a portion of the system of FIG. 2.

As shown in FIG. 3, the image processor includes three separate frame memories which allow each of the parameters $M_o$, $T_1$ and $T_2$ to be represented in a complete frame memory and interactive adjustment of more than one parameter is allowed. The intrinsic parameters are functions of position in the body and are similarly represented in the frame memories. As is conventional in imaging techniques, the values for each voxel of material are addressed in accordance with x and y values, the addressing technique being appropriate to the processing system used. The values from the frame memories are provided to digital synthesis circuitry 20. The selection controls 22 can be coupled to a microprocessor 30 which is advantageously part of the apparatus having the frame memories for which the Gould/DeAnza IP 8400 was previously suggested. This enhances the compatibility of these portions of the system.

Figure 4:
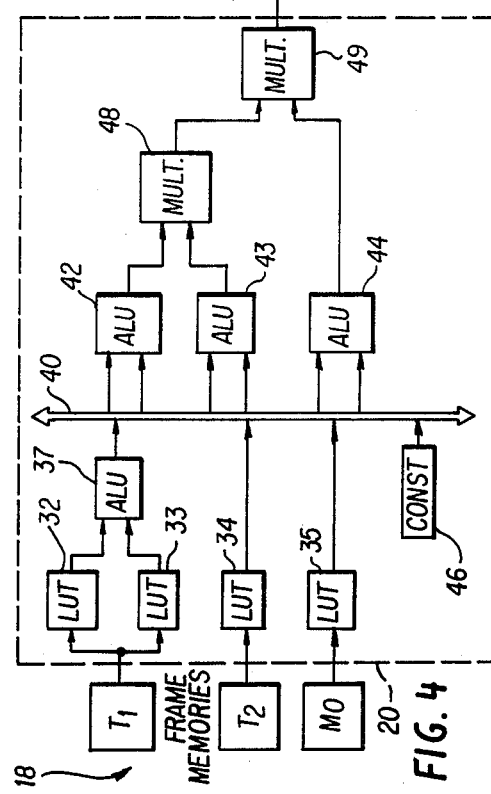
FIG. 4 is a schematic block diagram showing in greater detail a portion of the system of FIG. 3.

The digital synthesis circuitry is shown in greater detail in FIG. 4 which includes lookup tables 32, 33, 34 and 35. As will be recognized by those skilled in the art, the lookup tables are digital memory devices which have a predetermined number of address inputs and outputs. By suitably loading the contents of each address in the table, the device can be provided with its own distinctive transfer function. Thus, each lookup table can perform the task of a function generator. Thus, the contents of address m are loaded with the function f(m). When m is input to the lookup table, f(m) is read out. As shown in FIG. 4, $T_1$ is input to tables 32 and 33 and functions of $T_1$ can be read out of those tables.

For example, considering the middle term of the expression for signal intensity in an inversion recovery pulse sequence, this is an exponential function of the ratio of $-\tau:T_1$. When the operator uses the interactive controls 22 to establish a new value of $\tau$, microprocessor 30 simply goes through all permissible values of $T_1$ and generates the exponential function for each, using the new $\tau$ value. When this is completed, the new transfer function is loaded into lookup table 32 using standard circuitry which has been omitted for the sake of clarity. Similar functions are establishable in the other tables, depending upon the pulse sequence being employed.

The outputs of tables 32 and 33 are delivered to an arithmetic logic unit 37 which is connected to a data bus 40 to which the outputs of tables 34 and 35 are also connected. The bus is coupled to the inputs of arithmetic logic units 42, 43 and 44 in such a way that the outputs from ALU 37, table 34 or table 35 or the output of a constant factor generator 46 can be selected in pairs by anyone of ALU 42, 43 or 44. Thus, any of the functions are available to the arithmetic units which can then perform addition, subtraction, simple transfer, inversion, zero output, or alternate functions. Again, the functions of these conventional arithmetic units is chosen to be consistent with the expression appropriate to the pulse sequence selected.

The outputs of ALUs 42 and 43 are connected to a conventional multiplier 48, the output of which is connected to an input of a multiplier 49 along with the output of ALU 44. The output of multiplier 49 is connected to the digital-analog converter 24, and hence to the monitor. As is well known, the multiplier circuits receive two digital inputs and generate their product.

It should be understood that the processor is designed to operate at real time video rates. This means that all calculations required to generate a single synthesized image are done in 1/30 second video frame time. This is accomplished by first reading out in parallel from the three frame memories $T_1$, $M_o$ and $T_2$ as a function of x and y the pixel in the upper left hand corner, i.e., $T_1$ (1,1), $T_2$ (1,1), and $M_o$ (1,1). These values are input to tables 32-35 and approximately one microsecond later the synthesized signal for pixel (1,1) is fed to DAC 24. While this is going on, values at pixels (2,1), (3,1), etc. are read out from the three frame memories, typically at 100 nanosecond intervals and delivered to tables 32-35, one after the other. After the first line is completely read out, the pixels from the next line are read out and this sequence continues through the entire memory.

As will be recognized, registers for pulse synchronization, clock and address generators, power supplies and the like have been omitted as being conventional and not forming a direct part of the present invention, although such equipment is obviously necessary for operation of equipment of this type.

The manner in which this operation is performed with one of the pulse sequences can be understood by referred to the expression for spin-echo imaging which will be seen to have five terms. Two of these terms involve exponentials in which the exponent includes $T_1$.

Thus, $T_1$ is fed, pixel by pixel, to tables 32 and 33, the outputs of which become the third and fourth terms, respectively, of the expression. The fifth term, which is a function of $T_2$, is generated in table 34. The third and fourth terms are then algebraically combined in arithmetic logic unit 37 and furnished to bus 40. The quantity within the brackets is the output of ALU 42 and the product of this result along with the first and fifth terms is performed by multipliers 48 and 49. The other pulse sequences are accommodated simply by controlling the contents of the various tables or the functionality of the arithmetic logic unit and multipliers.

It should be stressed that all components used can be operated at frequencies as high as 10 mega Hertz or more, compatible with 512×512, 30 Hertz video imaging. Thus, whenever the operator alters a selectable parameter, the processor immediately calculates the new exponential transfer function and loads it immediately into the relevant lookup tables. This means that new values and an entire new contrast presentation can be generated with each successive frame of the monitor system, permitting the operator to try values of $\tau$ and $T_R$ until the area in which he is most interested exhibits optimum contrast. He can further randomly insert these values so that areas which may not have been recognized as significant become more clearly visible due to improved contrast, permitting a form of examination, without multiple measurements and without the constraints imposed by the presence of the patient and large, complicated equipment for much improved examination and diagnostic capabilities.

Figure 5:
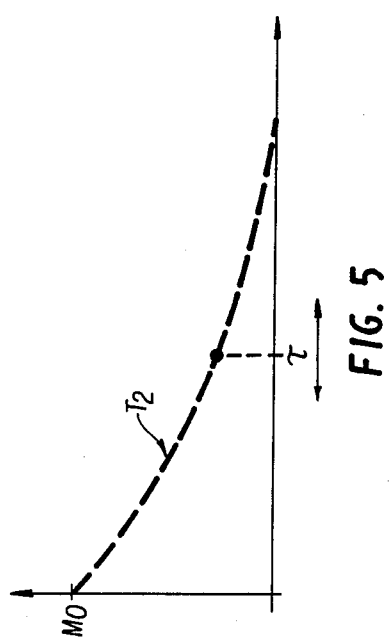
FIGS. 5 and 6 are graphical representations of the variation of an intrinsic parameter, illustrating the functions of selection of a selectable parameter.

FIG. 5 shows a graph of the variation of $T_2$ as a function of $M_o$ and $\tau$, illustrating that variations in $\tau$ affect $T_2$ in a nonlinear fashion. Varying $\tau$ can thus permit synthesis of alternate images having more desirable characteristics for special purposes.

Figure 6:
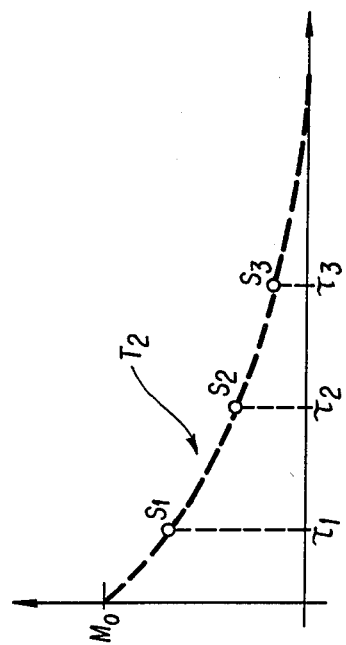

A similar relationship is shown in FIG. 6 wherein signal levels $S_1$, $S_2$ and $S_3$ are related to selected values of $\tau$ and $T_2$.

The system disclosed herein can also be used to apply some enhancement techniques in which the transfer functions applied to the LUT's are weighted to affect the computed values differently, thereby altering or enhancing the image.

Obviously, numerous additional modifications and variations of the present invention are possible in light of the above teachings. It is therefore to be understood that, within the scope of the appended claims, the invention may be practiced otherwise than as specifically described herein.

What is claimed as new and desired to be secured by Letters Patent of the United States is:

1. A method of forming computed images of materials within a body based on measurements of NMR characteristics of the body comprising the steps of selecting a set of values for at least one parameter including pulse delay $\tau$ or repetition time $T_R$ to be used in a small number of NMR measurements, making the measurements using those selected parameters in a predetermined NMR pulse sequence and collecting data from which an image of the body can be formed, calculating selected intrinsic parameters from the collected data for each point in a matrix of points in the body, the intrinsic parameters including at least one of spin-lattice relaxation time $T_1$, spin-spin relaxation time $T_2$ and net magnetization or proton density $M_o$, and computing for each point in the matrix a signal representative of a brightness based on the intrinsic parameters an arbitrary set of selectable values and a selected pulse sequence, thereby forming a matrix of brightness signal levels from which an image can be synthesized and displayed.

2. A method according to claim 1 wherein the predetermined NMR pulse sequence is a spin-echo sequence.

3. A method according to claim 1 wherein the predetermined NMR pulse sequence is a inversion recovery sequence.

4. A method according to claim 1 wherein the predetermined NMR pulse sequence is a partial saturation sequence.

5. A method according to claim 1 wherein said predetermined NMR pulse sequence is the same as said selected pulse sequence.

6. A method according to claim 1 wherein said predetermined NMR pulse sequence differs from said selected pulse sequence.

7. A method according to claim 1 wherein, after calculation of the intrinsic parameters, the step of computing is repetitively performed and images based thereon are successively synthesized and displayed, arbitrary sets of values being chosen and the results observed on a real time basis.

8. A method of forming computed images of materials within a body based on measurements of NMR characteristics of the body comprising the steps of
selecting a set of values for at least one parameter including pulse delay $\tau$ or repetition time $T_R$ to be used in a small number of NMR measurements,
making the measurements using those selected parameters in a predetermined NMR pulse sequence and collecting data from which an image of the body can be formed,
calculating selected intrinsic parameters from the collected data for each point in a matrix of points in the body, the intrinsic parameters including at least one of spin-lattice relaxation time $T_1$, spin-spin relaxation time $T_2$ and net magnetization or proton density $M_o$, and
repetitively computing for each point in the matrix a signal representative of a brightness based on the intrinsic parameters, a set of selectable parameters and a selected pulse sequence thereby forming a matrix of brightness signal levels from which an image can be synthesized, displaying and observing the synthesized images while concurrently and interactively altering the selectable parameters to obtain images having optimum contrast for visually chosen features.

9. A method according to claim 8 wherein the predetermined NMR pulse sequence is a spin-echo sequence.

10. A method according to claim 8 wherein the predetermined NMR pulse sequence is a inversion recovery sequence.

11. A method according to claim 8 wherein the predetermined NMR pulse sequence is a partial saturation sequence.

12. A method according to claim 8 wherein said predetermined NMR pulse sequence is the same as said selected pulse sequence.

13. A method according to claim 8 wherein said predetermined NMR pulse sequence differs from said selected pulse sequence.

14. A video processor for synthesizing and displaying images derived from NMR measurements of a body comprising
means for performing NMR measurements on a body using a predetermined pulse sequence;
control means for selectably establishing parameters controlling the characteristics of the pulse sequence including at least one of pulse delay time $\tau$ and repetition time $T_R$;
means for storing data from said measurements;
means for calculating from said data the intrinsic parameters for each of a matrix of pixels representative of points in the body, said parameters including at least one of spin-lattice relaxation time $T_1$, spin-spin relaxation time $T_2$ and net magnetization $M_o$ and for storing said parameters:
means for computing and storing a value for each pixel in said matrix representative of a brightness level, each said value being derived from the intrinsic parameter values for the point, a selected pulse sequence relationship and selected parameters $T_R$ and $\tau$, thereby forming a matrix representing a displayable image; and
means for displaying image.

* * * * *

UNITED STATES PATENT AND TRADEMARK OFFICE
CERTIFICATE OF CORRECTION

PATENT NO. : 4,573,014
DATED     : FEBRUARY 25, 1986
INVENTOR(S) : STEPHEN J. RIEDERER

It is certified that error appears in the above-identified patent and that said Letters Patent is hereby corrected as shown below:          Title page:

Under "Other Publications" - line 8, after "pp. 387-388" insert --SMRM (August, 1983)--;

line 15, after "p. 104" insert --SMRM (August, 1983)--;

line 16, after "pp. 272-273" insert --SMRM (August, 1983)--.

In the "Abstract" - line 3, delete "actually" and insert --actual--.

In the "Diagram" - Figure 2 - box diagram No. 12, delete "MENS" and insert --MEANS--;

box diagram No. 18, delete "$\overline{M}_0$" and insert --$M_0$--.

Signed and Sealed this

Nineteenth Day of August 1986

[SEAL]

Attest:

DONALD J. QUIGG

Attesting Officer

Commissioner of Patents and Trademarks